(12) United States Patent
Yasuda (10) Patent No.: US 9,546,769 B2
(45) Date of Patent: Jan. 17, 2017

(54) VEHICULAR LAMP

(71) Applicant: KOITO MANUFACTURING CO., LTD., Tokyo (JP)

(72) Inventor: Yuji Yasuda, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 120 days.

(21) Appl. No.: 14/450,013

(22) Filed: Aug. 1, 2014

(65) Prior Publication Data

US 2015/0036374 A1 Feb. 5, 2015

(30) Foreign Application Priority Data

Aug. 2, 2013 (JP) .................... 2013-161580

(51) Int. Cl.
| | |
|---|---|
| *F21V 7/00* | (2006.01) |
| *F21S 8/10* | (2006.01) |
| *H01L 33/48* | (2010.01) |
| *H01L 33/62* | (2010.01) |
| *H01L 33/64* | (2010.01) |

(52) U.S. Cl.
CPC .......... *F21S 48/328* (2013.01); *F21S 48/1104* (2013.01); *F21S 48/1109* (2013.01); *F21S 48/1159* (2013.01); *F21S 48/1305* (2013.01); *F21S 48/1323* (2013.01); *H01L 33/486* (2013.01); *H01L 33/62* (2013.01); *H01L 33/647* (2013.01); *H01L 2224/48091* (2013.01); *H01L 2224/48247* (2013.01); *H01L 2924/181* (2013.01)

(58) Field of Classification Search
CPC ... F21S 48/1104; F21S 48/1109; F21S 48/115; F21S 48/1159; F21S 48/1305; F21S 48/1323; F21S 48/328
See application file for complete search history.

(56) References Cited

U.S. PATENT DOCUMENTS

| | | | | |
|---|---|---|---|---|
| 7,705,365 B2* | 4/2010 | Kurokawa | ........... | G02B 6/0083 257/100 |
| 2006/0108597 A1* | 5/2006 | Takeda | .................. | H01L 25/167 257/100 |
| 2007/0206369 A1* | 9/2007 | Takeda | ................. | F21S 48/1109 361/820 |
| 2009/0059594 A1* | 3/2009 | Lin | .......................... | F21K 9/00 362/294 |
| 2011/0133217 A1* | 6/2011 | Hakamata | ............ | F21S 48/1109 257/88 |
| 2012/0294026 A1* | 11/2012 | Matsumoto | .......... | F21S 48/1104 362/517 |

FOREIGN PATENT DOCUMENTS

JP 2010-146817 A 7/2010

* cited by examiner

*Primary Examiner* — Peggy Neils
*Assistant Examiner* — Alexander Garlen
(74) *Attorney, Agent, or Firm* — Osha Liang LLP (57) ABSTRACT

A lamp that is mounted on a vehicle has a light-emitting element having a light-emitting portion, a first terminal, and a second terminal, a circuit board having a first surface on which the light-emitting element mounted is mounted, and a reflector that reflects light emitted from the light-emitting portion to a front of the light-emitting element. The first terminal supplies power to the light-emitting portion. The second terminal supports the light-emitting portion. The first terminal and the second terminal are arranged in a longitudinal direction. The second terminal is placed rearward of the first terminal.

8 Claims, 5 Drawing Sheets

VEHICULAR LAMP

BACKGROUND

Technical Field

The present invention relates to lamps that are mounted on vehicles.

Related Art

A lamp in which a light-emitting element as a light source is mounted on a first surface of a circuit board and a metal plate is fixed to a second surface of the circuit board is known as this type of lamp (see, e.g., Patent Document 1). The metal plate is placed so as to contact the second surface, and dissipates heat generated by the light-emitting element. As the heat is appropriately dissipated, operation of the light-emitting element is stabilized, and satisfactory light distribution characteristics can be obtained.

[Patent Document 1]

Japanese Patent Application Laid-Open (Kokai) No. 2010-146817

SUMMARY

One or more embodiments of the present invention provides a technique of further improving light distribution characteristics and heat dissipation capability in a vehicular lamp having a light-emitting element as a light source mounted on a circuit board.

According to one or more embodiments of the present invention, a lamp that is mounted on a vehicle, including: a light-emitting element having a light-emitting portion, a first terminal, and a second terminal; a circuit board having the light-emitting element mounted on a first surface of the circuit board; and a reflector that reflects light emitted from the light-emitting portion to a front of the light-emitting element, wherein the first terminal supplies power to the light-emitting portion, the second terminal supports the light-emitting portion, the first terminal and the second terminal are arranged in a longitudinal direction, and the second terminal is placed rearward of the first terminal.

In order to prevent the reflected light from the reflector from being blocked, it is desirable to minimize the number of element parts that are placed in front of the light-emitting element. In other words, since the element parts of the lamp tend to be placed rearward of the light-emitting element, a relatively large space can be easily secured rearward of the light-emitting element. The above configuration makes it easy to increase the area of a circuit pattern that is connected to the second terminal, by using the space rearward of the light-emitting element. Heat that is generated by the light-emitting portion due to light emission is dissipated through the second terminal supporting the light-emitting portion and the circuit pattern connected to the second terminal. Since a large area can be secured for this circuit pattern, heat dissipation efficiency can be improved. This further stabilizes operation of the light-emitting element, and satisfactory light distribution characteristics can be maintained.

A distance between the light-emitting element and a front end of the circuit board may be shorter than a distance between the light-emitting element and a rear end of the circuit board.

According to this configuration, a large area can be secured for the circuit pattern connected to the second terminal under such conditions that a longitudinal dimension of the circuit board is fixed. On the other hand, since the distance between the light-emitting element and the front end of the circuit board can be minimized under such conditions that a longitudinal dimension of the circuit pattern connected to the second terminal is fixed, the lamp can be reduced in size.

The light-emitting portion may have a cutout that forms an electrode portion, and the cutout may be placed on a side closer to the front end of the circuit board.

As the lamp that is mounted on the vehicle, it is common to provide a pair of a lamp that is placed on a left side of the vehicle and a lamp that is placed on a right side of the vehicle. In this pair of lamps, the circuit boards on which the light-emitting elements are mounted are formed so as to have configurations that are symmetrical to each other. Even if a light-emitting surface has an asymmetrical shape such as the light-emitting element that has the cutout in order to form the electrode portion, it is common to use the same light-emitting elements in the left and right lamps. According to the above configuration, since the first terminal and the second terminal of the light-emitting element are arranged in the longitudinal direction, the positions of the cutouts can be aligned between the left and right circuit boards. Since the same light-emitting elements can be used in the left and right lamps, parts cost is suppressed, and variation in light distribution characteristics therebetween can be suppressed.

The reflector may be installed on the circuit pattern connected to the second terminal.

In this case, a space required for installation of the reflector can be effectively used as a space for formation of the circuit pattern that contributes to heat dissipation. Since the circuit pattern having a large area improves heat dissipation efficiency, operation of the light-emitting element is stabilized, and satisfactory light distribution characteristics can be maintained.

The lamp may further include: a heat dissipation member mounted on a second surface of the circuit board which is located on an opposite side to the first surface.

A space for mounting the heat dissipation member can be easily secured on the second surface located on the opposite side to the first surface of the circuit board on which the light-emitting element and the reflector are placed. Accordingly, a large area can be secured for the heat dissipation member to contribute to heat dissipation. This further improves heat dissipation efficiency. Accordingly, operation of the light-emitting element is stabilized, and satisfactory light distribution characteristics can be maintained.

DETAILED DESCRIPTION

Embodiments of the present invention will be described in detail below with reference to the accompanying drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. The figures used in the following description have been scaled as appropriate so that each member is shown large enough to be recognized. The "right" and "left" in the following description mean the rightward and leftward directions as viewed from the driver's seat.

Figure 1:
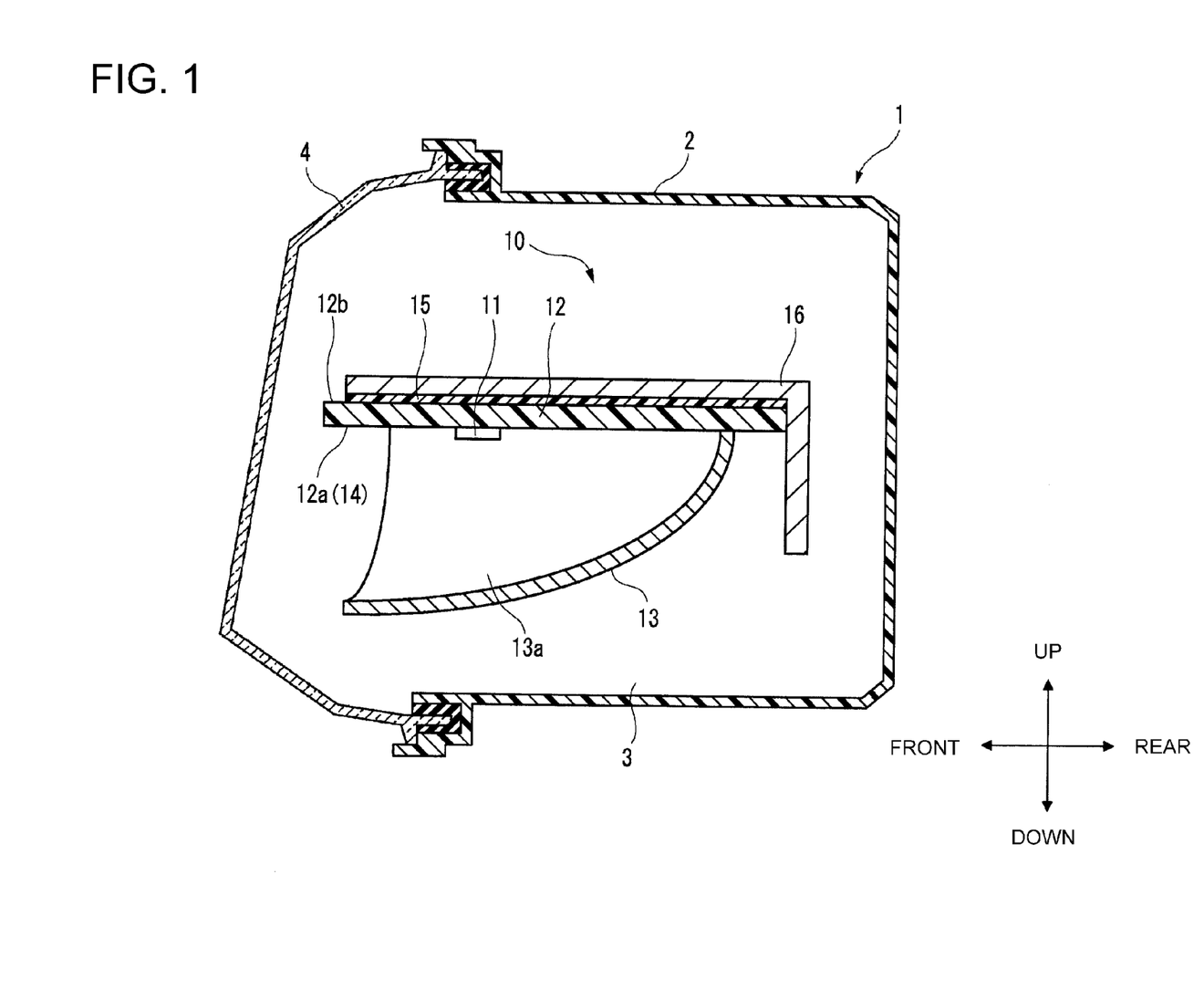
FIG. 1 is a diagram showing a headlamp including a lamp unit according to one or more embodiments of the present invention.

FIG. 1 is a sectional view showing a part of a headlamp apparatus 1 as an example of a lighting apparatus that is mounted on a vehicle, taken along a vertical plane and as viewed from the left side. The headlamp apparatus 1 is an apparatus that is mounted on the left side of the front part of the vehicle to illuminate an area ahead of the vehicle. The headlamp apparatus 1 includes a housing 2, a translucent cover 4 that is mounted on the housing 2 to define a lamp chamber 3. The translucent cover 4 is mounted on the housing 2 via a sealing adhesive. The housing 2 is made of, e.g., a resin. The translucent cover 4 is made of, e.g., a transparent resin.

A lamp unit 10 as an example of the lamp is placed in the lamp chamber 3. The lamp unit 10 includes a light-emitting element 11, a circuit board 12, a reflector 13, a heat dissipation sheet 15, and a heat dissipation plate 16.

The light-emitting element 11 is mounted on a first surface 12a of the circuit board 12. The circuit board 12 is made of, e.g., a resin. In one or more embodiments of the present invention, the light-emitting element 11 is a white light-emitting diode. In one or more embodiments of the present invention, the first surface 12a faces downward.

The reflector 13 has an inner surface 13a basically having the shape of a paraboloid. The inner surface 13a is a reflective surface. The reflector 13 is placed on the first surface 12a of the circuit board 12 so that the inner surface 13a faces the light-emitting element 11. Light emitted from the light-emitting element 11 is reflected in forward by the inner surface 13a of the reflector 13, and reaches the front of the headlamp apparatus 1 through the translucent cover 4. A predetermined region ahead of the headlamp apparatus 1 is thus illuminated.

The reflector 13 is made of, e.g., a metal or a resin. In the latter case, the reflective surface is formed by depositing a metal such as aluminum on the surface of the reflector 13. An insulating film 14 is formed between the first surface 12a of the circuit board 12 and the reflector 13. The insulating film 14 ensures insulation properties between a conductive circuit pattern (described in detail below) formed on the first surface 12a and the metal portion of the reflector 13.

The heat dissipation plate 16 is mounted on a second surface 12b of the circuit board 12, which is located on the opposite side to the first surface 12a, with the heat dissipation sheet 15 interposed therebetween. The heat dissipation sheet 15 and the heat dissipation plate 16 (an example of the heat dissipation member) dissipate heat that is generated by light emission of the light-emitting element 11. The heat dissipation sheet 15 is made of, e.g., a silicone or acrylic material, and has high thermal conduction properties. The heat dissipation plate 16 is formed by bending a metal plate into a desired shape. Flexibility of the heat dissipation sheet 15 increases adhesion of the heat dissipation plate 16, and thus can achieve satisfactory heat transfer from the circuit board 12 to the heat dissipation plate 16. The heat dissipation sheet 15 may be replaced with heat dissipation grease.

Figure 2A:
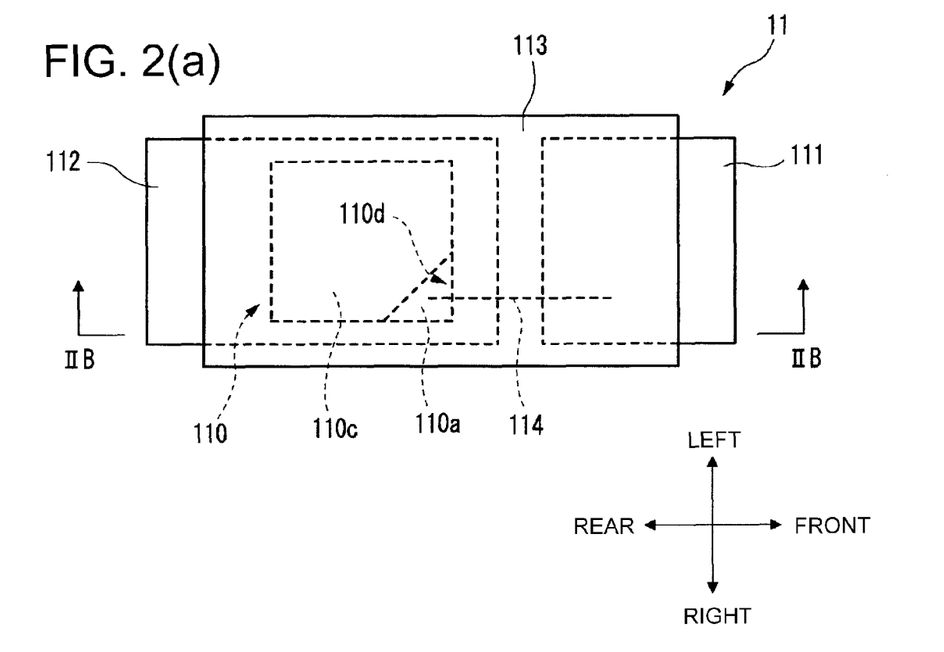
FIGS. 2(a)-2(b) show diagrams showing the configuration of a light-emitting element that is included in the lamp unit.
Figure 2B:
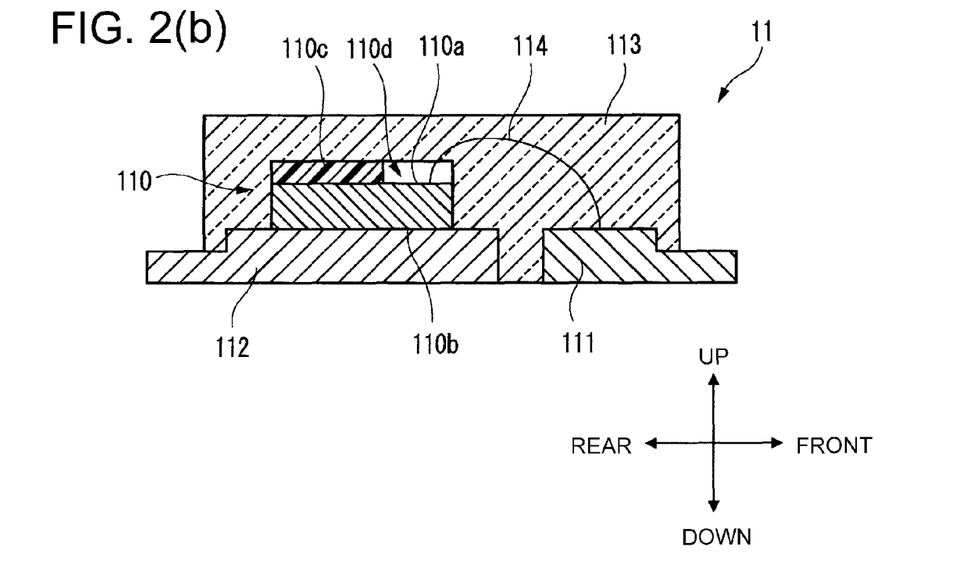

FIGS. 2(a)-(b) show diagrams schematically showing the configuration of the light-emitting element 11. FIG. 2(a) is a plan view of the light-emitting element 11 as viewed from below. FIG. 2(b) is a sectional view taken along line IIB-IIB in FIG. 2(a).

The light-emitting element 11 includes a diode chip 110 (an example of the light-emitting portion), a first lead frame 111 (an example of the first terminal), a second lead frame 112 (an example of the second terminal), and a resin seal portion 113. The diode chip 110 includes an anode electrode portion 110a, a cathode electrode portion 110b, and a fluorescent substance 110c.

The first lead frame 111 and the second lead frame 112 are made of a conductive material such as, e.g., a metal. The diode chip 110 is mounted on the second lead frame 112. More specifically, the cathode electrode portion 110b is electrically connected to the second lead frame 112. A cutout 110d is formed in a part of the fluorescent substance 110c forming a light-emitting surface, so that the anode electrode portion 110a is exposed. A non-light-emitting portion is formed by this portion. The anode electrode portion 110a and the first lead frame 111 are electrically connected to each other via a gold wire 114.

The resin seal portion 113 is molded so as to cover the diode chip 110, the first lead frame 111, the second lead frame 112, and the gold wire 114. The resin seal portion 113 is transparent so that light emitted through the fluorescent substance 110c can be transmitted therethrough.

Figure 3:
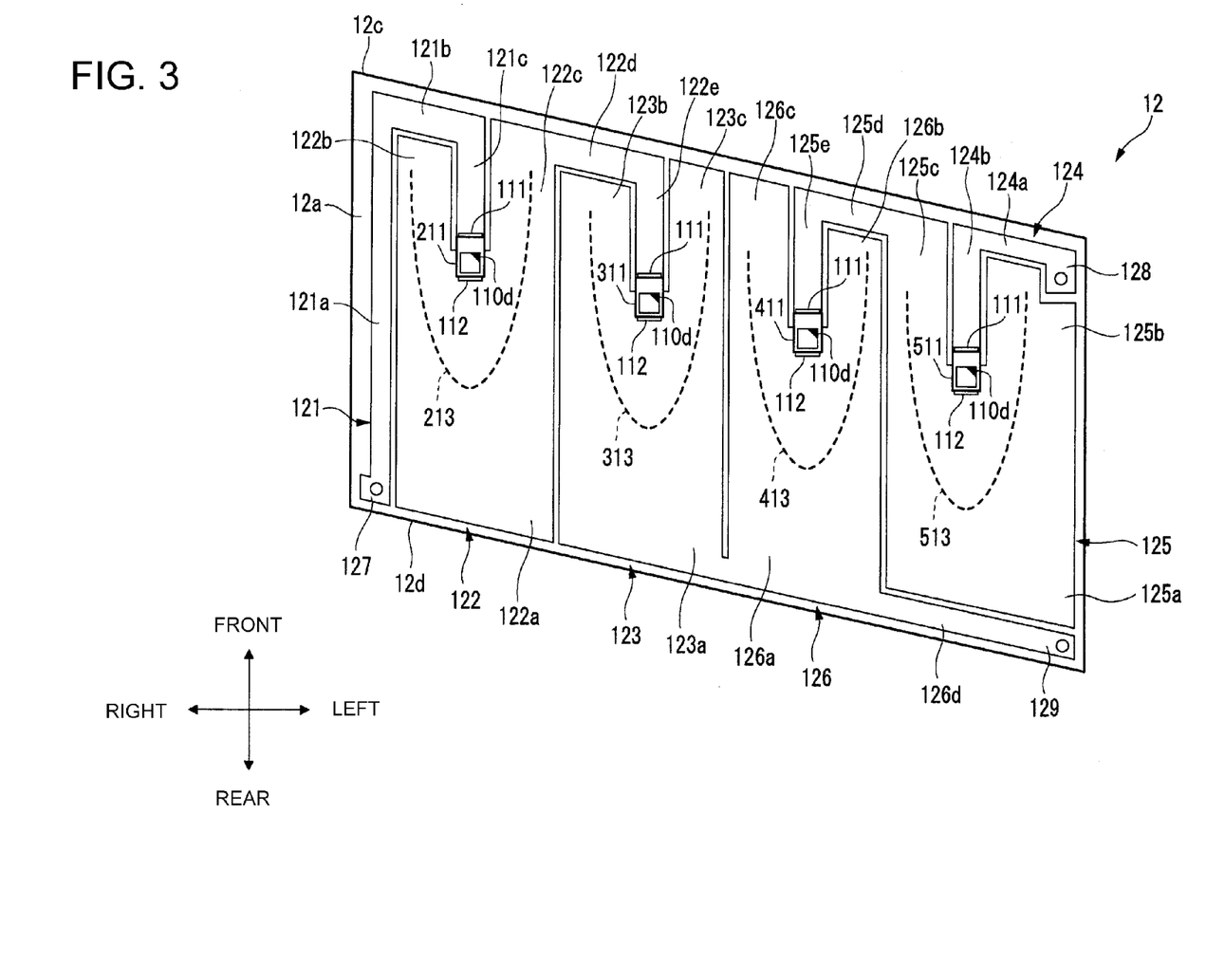
FIG. 3 is a diagram showing a circuit board that is included in the lamp unit, as viewed from below.

FIG. 3 is a plan view showing the appearance of the circuit board 12 as viewed from the first surface 12a. The insulating film 14 is formed on substantially the entire first surface 12a except for a region to which the first lead frame 111 and the second lead frame 112 are soldered. The insulating film 14 may also be formed on the second surface 12b.

Four light-emitting elements 211, 311, 411, 511 are mounted on the first surface 12a. Each of these four light-emitting elements has the same structure as the light-emitting element 11 described with reference to FIGS. 2(a)-2(b). The four light-emitting elements are collectively referred to as the "light-emitting element 11" as necessary.

In one or more embodiments of the present invention, the light-emitting elements 211, 311 are used as light sources that form a high beam pattern in front of the vehicle on which the lamp unit 10 is mounted. The light-emitting elements 411, 511 are used as light sources that form a low beam pattern in front of the vehicle. The high beam pattern is a light distribution pattern that illuminates a broad range ahead of the vehicle to a relatively far position. The low beam pattern is a light distribution pattern that illuminates a relatively short distance ahead of the vehicle and, e.g., below a horizontal line.

The circuit pattern is formed over the first surface 12a by using a conductive material. The circuit pattern includes a first pattern 121, a second pattern 122, a third pattern 123, a fourth pattern 124, a fifth pattern 125, a sixth pattern 126, a high beam power supply terminal 127, a low beam power supply terminal 128, and a ground terminal 129.

The high beam power supply terminal 127 is provided on the right rear end of the circuit board 12. The first pattern 121 has a first portion 121a, a second portion 121b, and a third portion 121c. The first portion 121a extends forward from the high beam power supply terminal 127. The second portion 121b extends leftward from the front end of the first portion 121a. The third portion 121c extends rearward from the left end of the second portion 121b, and is electrically connected to the first lead frame 111 of the light-emitting element 211.

The second pattern 122 has a first portion 122a, a second portion 122b, a third portion 122c, a fourth portion 122d, and a fifth portion 122e. The first portion 122a is electrically connected to the second lead frame 112 of the light-emitting element 211, and extends rearward of the light-emitting element 211. The second portion 122b extends forward from the front end of the first portion 122a along the right end of the third portion 121c of the first pattern 121. The third portion 122c extends forward from the front end of the first portion 122a along the left end of the third portion 121c of the first pattern 121. The fourth portion 122d extends leftward from the front end of the third portion 122c. The fifth portion 122e extends rearward from the left end of the fourth portion 122d, and is electrically connected to the first lead frame 111 of the light-emitting element 311.

The third pattern 123 has a first portion 123a, a second portion 123b, and a third portion 123c. The first portion 123a is electrically connected to the second lead frame 112 of the light-emitting element 311, and extends rearward of the light-emitting element 311. The second portion 123b extends forward from the front end of the first portion 123a along the right end of the fifth portion 122e of the second pattern 122. The third portion 123c extends forward from the front end of the first portion 123a along the left end of the fifth portion 122e of the second pattern 122.

The low beam power supply terminal 128 is provided on the left front end of the circuit board 12. The fourth pattern 124 has a first portion 124a and a second portion 124b. The first portion 124a extends rightward from the low beam power supply terminal 128. The second portion 124b extends rearward from the right end of the first portion 124a, and is electrically connected to the first lead frame 111 of the light-emitting element 511.

The fifth pattern 125 has a first portion 125a, a second portion 125b, a third portion 125c, a fourth portion 125d, and a fifth portion 125e. The first portion 125a is electrically connected to the second lead frame 112 of the light-emitting element 511, and extends rearward of the light-emitting element 511. The second portion 125b extends forward from the front end of the first portion 125a along the left end of the second portion 124b of the fourth pattern 124. The third portion 125c extends forward from the front end of the first portion 125a along the right end of the second portion 124b of the fourth pattern 124. The fourth portion 125d extends rightward from the front end of the third portion 125c. The fifth portion 125e extends rearward from the right end of the fourth portion 125d, and is electrically connected to the first lead frame 111 of the light-emitting element 411.

The sixth pattern 126 has a first portion 126a, a second portion 126b, a third portion 126c, and a fourth portion 126d. The first portion 126a is electrically connected to the second lead frame 112 of the light-emitting element 411, and extends rearward of the light-emitting element 411. The second portion 126b extends forward from the front end of the first portion 126a along the left end of the fifth portion 125e of the fifth pattern 125. The third portion 126c extends forward from the front end of the first portion 126a along the right end of the fifth portion 125e of the fifth pattern 125. The fourth portion 126d extends leftward from the rear end of the first portion 126a.

The ground terminal 129 is provided on the left rear end of the circuit board 12. The left end of the fourth portion 126d of the sixth pattern 126 reaches the ground terminal 129. The rear end portion of the first portion 123a of the third pattern 123 is connected to the rear end portion of the first portion 126a of the sixth pattern 126. Accordingly, the first portion 123a of the third pattern 123 and the first portion 126a of the sixth pattern 126 have the same potential as the ground terminal 129.

That is, when power is supplied from the high beam power supply terminal 127, the power is supplied to from the first lead frames 111 of the light-emitting elements 211, 311 to the diode chips 110 thereof, and light is emitted from the light-emitting elements 211, 311.

When power is supplied from the low beam power supply terminal 128, the power is supplied to from the first lead frames 111 of the light-emitting elements 411, 511 to the diode chips 110 thereof, and light is emitted from the light-emitting elements 411, 511.

Broken parabolic curves shown in FIG. 3 represent installation positions of the reflector. Reflectors 213, 313, 413, 513 are placed so as to face the four light-emitting elements 211, 311, 411, 511, respectively. These four reflectors have the same structure as the reflector 13 described with reference to FIG. 1. These four reflectors are collectively referred to as the "reflector 13" as necessary. Light emitted from each light-emitting element 211, 311, 411, 511 is reflected to a front of the light-emitting element 211, 311, 411, 511 by a corresponding one of the reflectors 213, 313, 413, 513.

In one or more embodiments of the present invention, the first lead frame 111 and the second lead frame 112 of the light-emitting element 11 are arranged in the longitudinal direction. The second lead frame 112 supporting the diode chip 110 is placed rearward of the first lead frame 111.

In order to prevent reflected light from the reflector 13 from being blocked, it is desirable to minimize the number of element parts that are placed in front of the light-emitting element 11. In other words, since the element parts of the lamp unit 10 tend to be placed rearward of the light-emitting element 11, a relatively large space can be easily secured rearward of the light-emitting element 11. The above configuration makes it easy to increase the area of the circuit pattern that is connected to the second lead frame 112, by using the space rearward of the light-emitting element 11. Heat that is generated by the diode chip 110 due to light emission is dissipated through the second lead frame 112 supporting the diode chip 110 and the circuit pattern connected to the second lead frame 112. Since a large area can be secured for this circuit pattern, heat dissipation efficiency can be improved. This further stabilizes operation of the light-emitting element 11, and satisfactory light distribution characteristics can be maintained.

Since the first lead frame 111 and the second lead frame 112 are arranged in the longitudinal direction, the circuit pattern connected to the first and second lead frames 111, 112 can have a shape extending in the longitudinal direction. For example, a portion that does not substantially contribute to heat dissipation, such as the third portion 121c of the first pattern 121, may have an elongated shape extending in the longitudinal direction, and portions that contribute to heat dissipation, such as the second portion 122b and the third portion 122c of the second pattern 122, may be placed on both sides thereof. This can ensure a large heat dissipation area.

As shown in FIG. 3, the distance between the light-emitting element 11 and a front end 12c of the circuit board 12 is shorter than that between the light-emitting element 11 and a rear end 12d of the circuit board 12.

According to this configuration, a large area can be secured for the circuit pattern connected to the second lead frame 112 under such conditions that the longitudinal dimension of the circuit board 12 is fixed (corresponding to the case where the longitudinal dimension of the lamp chamber 3 is predetermined etc.). On the other hand, since the distance between the light-emitting element 11 and the front end 12c of the circuit board 12 can be minimized under such conditions that the longitudinal dimension of the circuit pattern connected to the second lead frame 112 is fixed (corresponding to the case where the dimension of the space where the element parts of the lamp unit 10 are placed is predetermined etc.), the size of the lamp unit 10 can be reduced. This suppresses the capacity of the lamp chamber 3, and contributes to reduction in size and weight of the headlamp apparatus 1.

As shown in FIG. 3, the reflector 13 is installed on the circuit pattern connected to the second lead frame 112 of the light-emitting element 11.

In other words, the space required for installation of the reflector 13 is effectively used as a space for formation of the circuit pattern that contributes to heat dissipation. Since the circuit pattern having a large area improves heat dissipation efficiency, operation of the light-emitting element 11 is stabilized, and satisfactory light distribution characteristics can be maintained.

As described with reference to FIG. 1, the heat dissipation sheet 15 and the heat dissipation plate 16 are mounted on the second surface 12b of the circuit board 12.

A space for mounting the heat dissipation sheet 15 and the heat dissipation plate 16 can be easily secured on the second surface 12b located on the opposite side to the first surface 12a of the circuit board 12 on which the light-emitting element 11 and the reflector 13 are placed. Accordingly, a large area can be secured for the heat dissipation sheet 15 and the heat dissipation plate 16 to contribute to heat dissipation. This further improves heat dissipation efficiency. Accordingly, operation of the light-emitting element 11 is stabilized, and satisfactory light distribution characteristics can be maintained.

As shown in FIG. 3, the cutout 110d formed in the diode chip 110 included in the light-emitting element 11 is placed on the side closer to the front end 12c of the circuit board 12.

Figure 4:
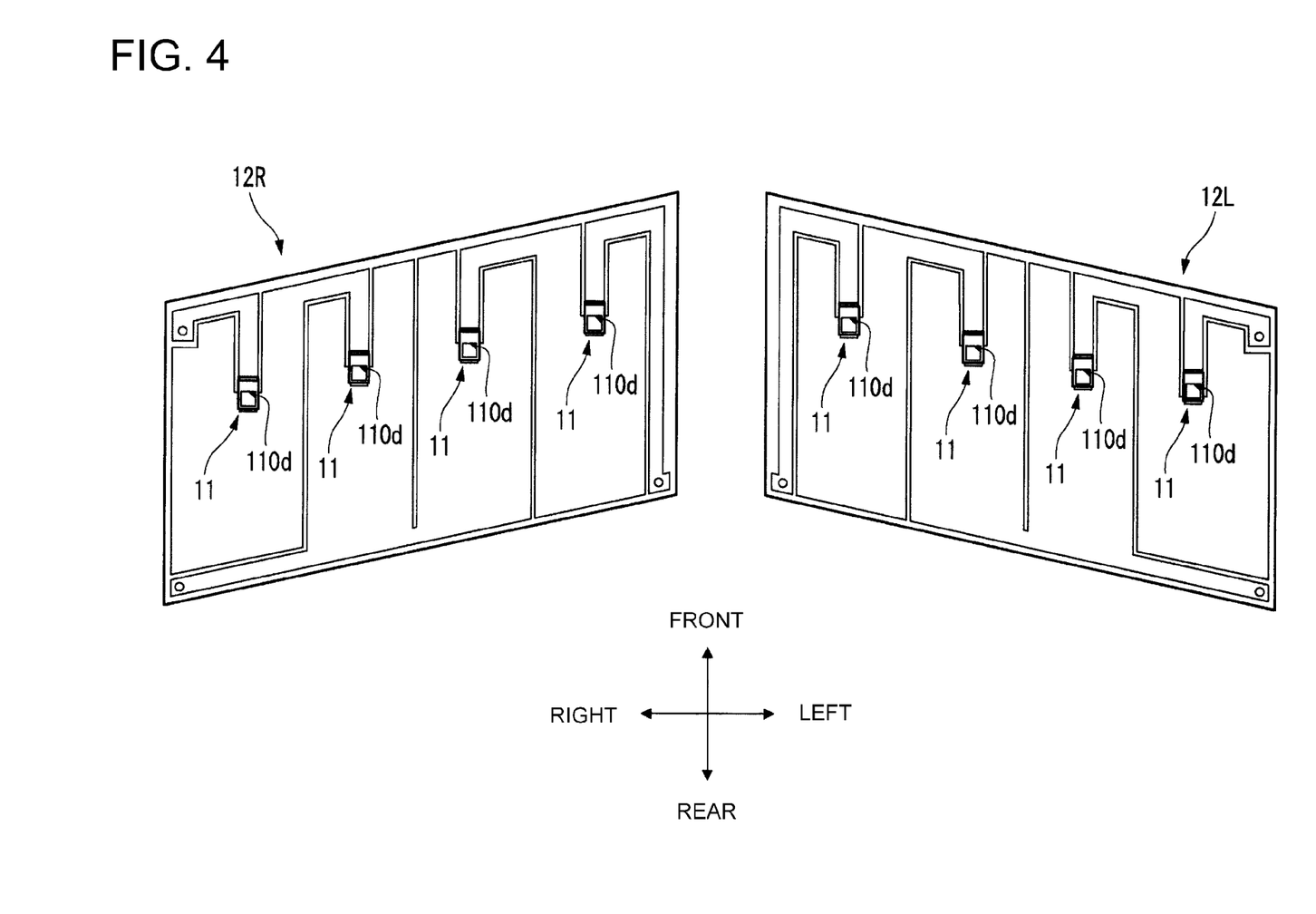
FIG. 4 is a diagram showing a pair of a circuit board that is included in a left headlamp and a circuit board that is included in a right headlamp, as viewed from below.

As the lamp that is mounted on the vehicle, it is common to provide a pair of a lamp that is placed on the left side of the vehicle and a lamp that is placed on the right side of the vehicle. In this pair of lamps, the circuit boards on which the light-emitting elements are mounted are formed so as to have configurations that are symmetrical to each other. In FIG. 4, the circuit board 12 described with reference to FIGS. 1 to 3 (the circuit board provided in the headlamp apparatus 1 that is placed on the left side of the vehicle) is shown by reference numeral 12L. A circuit board 12R is a circuit board provided in a headlamp apparatus (having a configuration symmetrical to that of the above headlamp apparatus 1) that is placed on the right side of the vehicle. The shape of the circuit pattern and the arrangement of circuit elements, not shown, are symmetrical to those of the circuit board 12L.

Even if the light-emitting surface has an asymmetrical shape such as the diode chip 110 that has the cutout 110d in order to form the anode electrode portion 110a, it is common to use the same light-emitting elements 11 in the left and right lamps. According to the configuration of one or more embodiments of the present invention, since the first lead frame 111 and the second lead frame 112 of the light-emitting element 11 are arranged in the longitudinal direction, the positions of the cutouts 110d can be aligned between the left and right circuit boards 12L, 12R.

Figure 5:
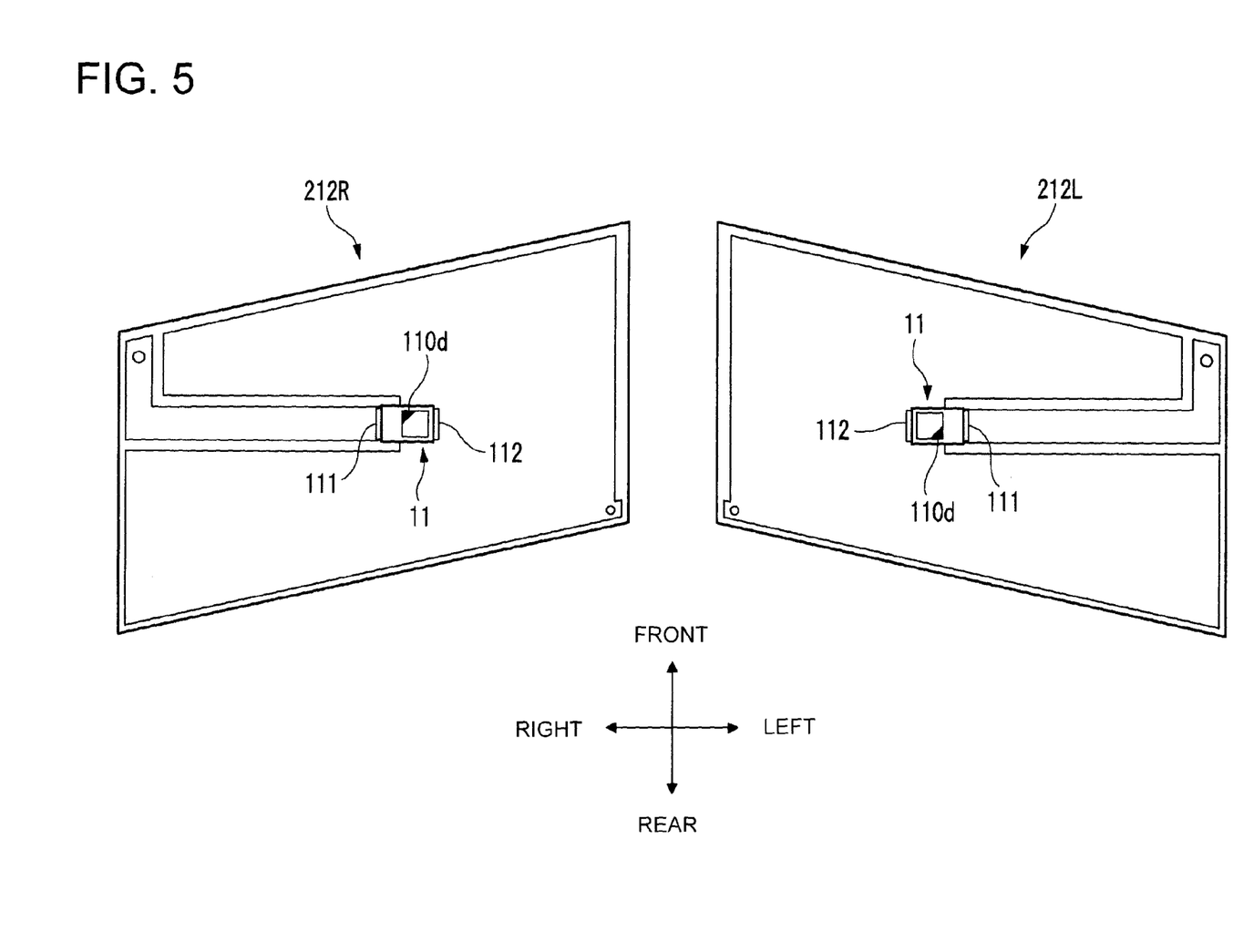
FIG. 5 is a diagram showing a pair of circuit board according to a comparative example, as viewed from below.

This fact will be described with reference to a comparative example shown in FIG. 5. A circuit board 212L and a circuit board 212R are provided in a headlamp apparatus that is placed on the left side of a vehicle and a headlamp apparatus that is placed on the right side of a vehicle, respectively. The shape of the circuit pattern formed on the circuit board 212L is symmetrical to that of the circuit pattern formed on the circuit board 212R. The light-emitting elements 11 have the same configuration as that described with reference to FIGS. 1 to 4. In this comparative example, the respective light-emitting elements 11 are mounted on the circuit boards 212L, 212R so that the first lead frame 111 and the second lead frame 112 are arranged in the lateral direction.

In the case of such terminal arrangement, if the respective light-emitting elements 11 having the same configuration are mounted on the circuit boards 212L, 212R that are symmetrical in configuration to each other, the positions of the cutouts 110d are not aligned between the left and right circuit boards 212L, 212R. In particular, if the positions of the cutouts 110d are not aligned in the longitudinal direction (the traveling direction of reflected light from the reflector), light distribution characteristics tend to vary between the headlamp apparatuses. The parts cost increases if different light-emitting elements (two kinds of light-emitting elements that are symmetrical in structure to each other) are used in the left and right circuit boards in order to eliminate this problem.

As described above with reference to FIG. 4, according to the terminal arrangement of one or more embodiments of the present invention, even if the light-emitting elements 11 having the same configuration are mounted on the circuit boards 12L, 12R that are symmetrical in configuration to each other, the positions of the cutouts 110d can be aligned therebetween. It is ideal in terms of the light distribution characteristics that the cutouts 110d in the circuit board 12L and the cutouts 110d in the circuit board 12R are positioned symmetrically to each other. However, the above configuration can significantly suppress the influence on the light distribution characteristics as compared to the case where the positions of the cutouts 110d are not aligned in the longitudinal direction. Accordingly, since the same light-emitting elements 11 can be used in the left and right lamps, the parts cost is suppressed, and satisfactory light distribution characteristics can be obtained.

As described above with reference to FIGS. 2(a)-2(b), the cutout 110d is formed for wire-bonding the first lead frame 111 to the anode electrode portion 110a. Placing this cutout 10d on the side closer to the front end 12c of the circuit board 12 allows the first lead frame 111 to be placed forward of the second lead frame 112. Since the first lead frame 111 and the circuit pattern connected thereto do not substantially contribute to heat dissipation, the space on the front side of the circuit board 12 can be minimized.

In this case, a large area can be secured for the circuit pattern connected to the second lead frame 112 under such conditions that the longitudinal dimension of the circuit board 12 is fixed (corresponding to the case where the longitudinal dimension of the lamp chamber 3 is predetermined etc.). On the other hand, since the distance between the light-emitting element 11 and the front end 12c of the circuit board 12 can be minimized under such conditions that the longitudinal dimension of the circuit pattern connected to the second lead frame 112 is fixed (corresponding to the case where the dimension of the space where the element parts of the lamp unit 10 are placed is predetermined etc.), the size of the lamp unit 10 can be reduced. This suppresses the capacity of the lamp chamber 3, and contributes to reduction in size and weight of the headlamp apparatus 1.

The above embodiments are shown in order to facilitate understanding of the present invention, and are not intended to limit the present invention. It is to be understood that the embodiments can be modified or improved without departing from the subject matter of the present invention, and such equivalents are within the scope of the present invention.

The number of light-emitting elements 11 that are mounted on the circuit board 12 and the arrangement thereof are not limited to the example shown in the above embodiments. The shape of the circuit pattern formed on the circuit board 12 and the placement thereof are also not limited to the example shown in the above embodiments. The number of light-emitting elements 11 and the arrangement thereof and the shape of the circuit pattern and the arrangement thereof can be changed as appropriate according to the specification of the lamp unit 10 as long as the first lead frame 111 and the second lead frame 112 of the light-emitting element 11 are arranged in the longitudinal direction and the second lead frame 112 is placed rearward of the first lead frame.

The light-emitting element 11 is not limited to the white light-emitting diode. The light-emitting element 11 may be a light-emitting diode that emits light of a predetermined color as long as it has a light-emitting portion and at least two terminals, one of the terminals is used to supply power to the light-emitting portion, and the other terminal supports the light-emitting portion. A semiconductor light-emitting element such as an organic EL element or a laser diode may be used as the light-emitting element 11. The light-emitting surface formed by the fluorescent substance 110c etc. need not necessarily have an asymmetrical shape due to the cutout 110d etc.

The lighting apparatus on which the lamp unit 10 is mounted is not limited to the headlamp apparatus 1. The above lamp unit 10 can be mounted on an appropriate vehicular lighting apparatus as long as light emitted from the light-emitting element 11 is emitted by the reflector 13 to a front of the light-emitting element 11. That is, the direction to the front of the light-emitting element 11 need not necessarily be the direction to the front of the vehicle.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF THE REFERENCE NUMERALS

10 LAMP UNIT
11 LIGHT-EMITTING ELEMENT
12 CIRCUIT BOARD
12a FIRST SURFACE OF CIRCUIT BOARD
12b SECOND SURFACE OF CIRCUIT BOARD
12c FRONT END OF CIRCUIT BOARD
12d REAR END OF CIRCUIT BOARD
13 REFLECTOR
110 DIODE CHIP
110a ANODE ELECTRODE PORTION
110d CUTOUT
111 FIRST LEAD FRAME
112 SECOND LEAD FRAME
121 FIRST PATTERN
122 SECOND PATTERN
123 THIRD PATTERN
124 FOURTH PATTERN
125 FIFTH PATTERN
126 SIXTH PATTERN

The invention claimed is:

1. A lamp that is mounted on a vehicle, comprising:
a light-emitting element comprising:
a light-emitting portion,
a first terminal, and
a second terminal;
a circuit board comprising a first surface on which the light-emitting element is mounted; and
a reflector that reflects light emitted from the light-emitting portion to a front of the light-emitting element,
wherein the first terminal supplies power to the light-emitting portion,
wherein the second terminal supports the light-emitting portion,
wherein the first terminal and the second terminal are arranged in a longitudinal direction,
wherein the second terminal is placed rearward of the first terminal,
wherein the first terminal and the light-emitting portion are connected to each other via a gold wire,
wherein a first circuit pattern and a second circuit pattern are formed over the first surface of the circuit board, wherein the first circuit pattern is connected to the first terminal, the second circuit pattern is connected to the second terminal, and the reflector is installed on the second circuit pattern connected to the second terminal.

2. The lamp according to claim 1,
wherein a distance between the light-emitting element and a front end of the circuit board is shorter than a distance between the light-emitting element and a rear end of the circuit board.

3. The lamp according to claim 1,
wherein the light-emitting portion has a cutout that forms an electrode portion, and
wherein the cutout is placed on a side closer to the front end of the circuit board.

4. The lamp according to claim 1, further comprising:
a heat dissipation member mounted on a second surface of the circuit board which is located on an opposite side to the first surface.

5. The lamp according to claim 2,
wherein the light-emitting portion has a cutout that forms an electrode portion, and
wherein the cutout is placed on a side closer to the front end of the circuit board.

6. The lamp according to claim 2, further comprising:
a heat dissipation member mounted on a second surface of the circuit board which is located on an opposite side to the first surface.

7. The lamp according to claim 3, further comprising:
a heat dissipation member mounted on a second surface of the circuit board which is located on an opposite side to the first surface.

8. The lamp according to claim 1, wherein an entirety of the second terminal is placed rearward of an entirety of the first terminal.

* * * * *